(12) United States Patent
Kang (10) Patent No.: US 9,147,450 B2
(45) Date of Patent: Sep. 29, 2015

(54) SEMICONDUCTOR MEMORY APPARATUS

(71) Applicant: SK hynix Inc., Icheon-si Gyeonggi-do (KR)

(72) Inventor: Kyeong Pil Kang, Icheon-si (KR)

(73) Assignee: SK Hynix Inc., Gyeonggi-do (KR)

(*) Notice: Subject to any disclaimer, the term of this patent is extended or adjusted under 35 U.S.C. 154(b) by 0 days.

(21) Appl. No.: 14/208,633

(22) Filed: Mar. 13, 2014

(65) Prior Publication Data

US 2015/0092500 A1 Apr. 2, 2015

(30) Foreign Application Priority Data

Sep. 30, 2013 (KR) .................. 10-2013-0116268

(51) Int. Cl.
*G11C 5/14* (2006.01)
*G11C 7/12* (2006.01)

(52) U.S. Cl.
CPC .. *G11C 7/12* (2013.01); *G11C 5/14* (2013.01); *G11C 5/143* (2013.01)

(58) Field of Classification Search
CPC ...................................................... G11C 5/143
USPC ............................................................ 365/227
See application file for complete search history.

(56) References Cited

U.S. PATENT DOCUMENTS

| 5,831,924 | A  | * | 11/1998 | Nitta et al. ............... 365/189.17 |
| 6,079,023 | A  | * | 6/2000  | Yoon et al. .................... 713/300 |
| 6,285,621 | B1 | * | 9/2001  | Beer ............................ 365/226 |
| 2010/0302877 | A1 | * | 12/2010 | Bang ....................... 365/189.07 |
| 2012/0126840 | A1 | * | 5/2012  | Lee et al. ................... 324/750.3 |

FOREIGN PATENT DOCUMENTS

KR 1020100123234 A 11/2010

* cited by examiner

*Primary Examiner* — Hoai V Ho
*Assistant Examiner* — Jay Radke
(74) *Attorney, Agent, or Firm* — William Park & Associates Ltd.

(57) ABSTRACT

A semiconductor memory apparatus includes a first data storage region configured to be supplied with a driving voltage via a first voltage line, a second data storage region configured to be supplied with a driving voltage via a second voltage line and a switch configured to one of electrically couple the first voltage line with the second voltage line and decouple the first voltage line from the second voltage line in response to a switching control signal.

15 Claims, 4 Drawing Sheets

SEMICONDUCTOR MEMORY APPARATUS

CROSS-REFERENCES TO RELATED APPLICATION

The present application claims priority under 35 U.S.C. §119(a) to Korean application number 10-2013-0116268, filed on Sep. 30, 2013, in the Korean Intellectual Property Office, which is incorporated herein by reference in its entirety.

TECHNICAL FIELD

Various embodiments relate to a semiconductor integrated circuit, and more particularly, to a semiconductor memory apparatus.

BACKGROUND

A semiconductor memory apparatus typically includes a plurality of data storage regions. One or more internal voltage lines are often used to distribute an external voltage received from an external voltage source to the plurality of data storage regions. In many cases the internal voltage lines distribute the received voltage in a generally uniform manner to the plurality of data storage regions.

In some cases, different data storage regions may perform different operations. In some instances different data storage regions may process different amounts of input/output data. One or more of the data storage regions may consume different amounts of power compared to the other data storage regions.

SUMMARY

In an embodiment, a semiconductor memory apparatus includes a first data storage region configured to be supplied with a driving voltage via a first voltage line, a second data storage region configured to be supplied with a driving voltage via a second voltage line, and a switch configured to one of electrically couple the first voltage line to the second voltage line and electrically decouple the first voltage line from the second voltage line in response to a switching control signal.

In an embodiment, a semiconductor memory apparatus includes a plurality of data storage regions, wherein each of the plurality of data storage regions is configured to be electrically coupled with one of a plurality of voltage lines and receive a driving voltage via the associated voltage line, a plurality of switches configured to one of electrically couple the plurality of voltage lines to each other and electrically decouple the plurality of voltage lines from one another in response to a switching control signal, and a switching control signal generation block configured to enable the switching control signal when all voltage levels of the plurality of voltage lines are relatively lower than a voltage level of a reference voltage.

In an embodiment, a semiconductor memory apparatus includes a first data storage region and a third data storage region configured to receive a driving voltage via a first voltage line, a second data storage region and a fourth data storage region configured to receive a driving voltage via a second voltage line, and a switch configured to one of electrically couple the first voltage line with the second voltage line and electrically decouple the first voltage line from the second voltage line in response to a switching control signal.

In an embodiment, a system includes a memory controller and a semiconductor memory apparatus electrically coupled to the memory controller. The semiconductor memory device includes a first data storage region configured to be supplied with a driving voltage via a first voltage line, a second data storage region configured to be supplied with a driving voltage via a second voltage line, and a switch configured to one of electrically couple the first voltage line with the second voltage line and electrically decouple the first voltage line from the second voltage line in response to a switching control signal.

DETAILED DESCRIPTION

Various embodiments of a semiconductor memory apparatus will be described below with reference to the accompanying drawings.

Figure 1:
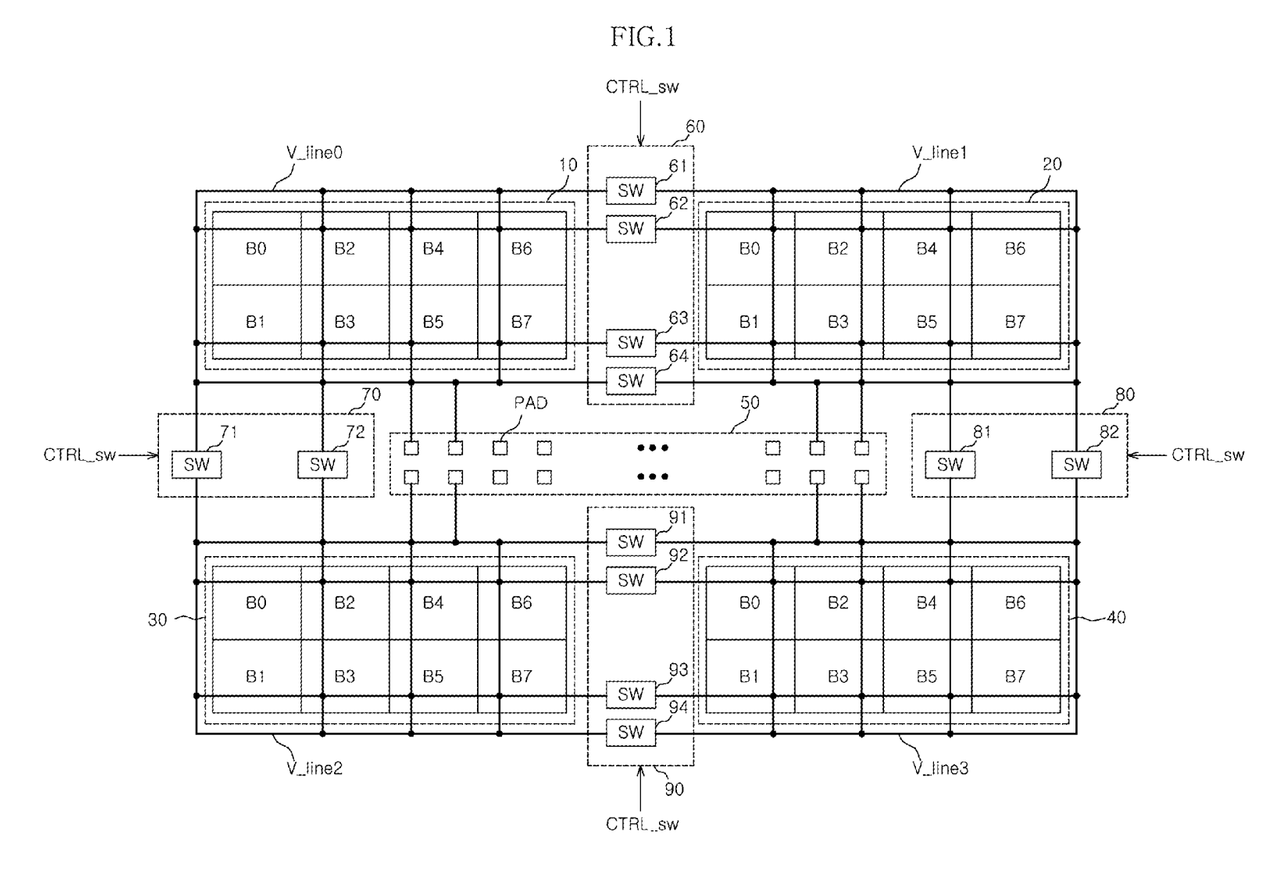
FIG. 1 is a configuration diagram of an embodiment of a semiconductor memory apparatus.

Referring to FIG. 1, an embodiment of a semiconductor memory apparatus is shown. The semiconductor memory apparatus is configured to be powered by an external voltage source. The semiconductor memory apparatus includes a first data storage region 10, a second data storage region 20, a third data storage region 30, a fourth data storage region 40, a pad group 50, first switch group 60, a second switch group 70, a third switch group 80, a fourth switch group 90, and first voltage line V_line0, a second voltage line V_line1, a third voltage line V_line2 and a fourth voltage line V_line3.

Each of the first, second, third and fourth data storage regions 10, 20, 30 40 includes eight banks B0, B1, B2, B3, B4, B5, B6, B7. Each bank is configured to store data and to output stored data. While in FIG. 2, each data storage region is shown as including eight banks, the number of banks included in each data storage region may, for example, include more than eight banks or fewer than eight banks. The first, second third and fourth data storage regions 10, 20, 30, 40 may operate as different channels and may generally simultaneously perform data input/output operations. The first, second, third and fourth voltage lines V_line0, V_line1, V_line2, V_line3 are configured to supply a driving voltage, to each of the first, second, third and fourth data regions 10, 20, 30, 40, respectively. The first data storage region 10 operates by being applied with a driving voltage via the first voltage line V_line0. The first voltage line V_line0 is configured to be electrically coupled to the eight banks B0, B1, B2, B3, B4, B5, B6, B7 of the first data storage region 10 in a mesh pattern. The driving voltage is applied to the eight banks B0, B1, B2, B3, B4, B5, B6, B7 of the first data storage region 10 via the first voltage line V_line0, where the first voltage line V_line0 is configured to pass through all the banks B0, B1, B2, B3, B4, B5, B6, B7 in the mesh pattern.

The second data storage region 20 operates by being applied with the driving voltage via the second voltage line V_line1. The second voltage line V_line1 is configured to be electrically coupled to the eight banks B0, B1, B2, B3, B4, B5, B6, B7 of the second data storage region 20 in a mesh pattern. The driving voltage is supplied to the eight banks B0, B1, B2, B3, B4, B5, B6, B7 of the second data storage region 20 via the second voltage line V_line1, where the second voltage line V_line1 is configured to pass through all the banks B0, B1, B2, B3, B4, B5, B6, B7 in the mesh pattern.

The third data storage region 30 operates by being applied with the driving voltage via the third voltage line V_line2. The third voltage line V_line2 is configured to be electrically coupled to the eight banks B0, B1, B2, B3, B4, B5, B6, B7 of the third data storage region 30 in a mesh pattern. The driving voltage is supplied to the eight banks B0, B1, B2, B3, B4, B5, B6, B7 of the third data storage region 30 via the third voltage line V_line2, where the third voltage line V_line2 is configured to pass through all the banks B0, B1, B2, B3, B4, B5, B6, B7 in the mesh pattern.

The fourth data storage region 40 operates by being applied with the driving voltage via the fourth voltage line V_line3. The fourth voltage line V_line3 is configured to be electrically coupled to the eight banks B0, B1, B2, B3, B4, B5, B6, B7 of the fourth data storage region 40 in a mesh pattern. The driving voltage is supplied to the eight banks B0, B2, B3, B4, B5, B6, B7 of the fourth data storage region 40 via the fourth voltage line V_line3, where the fourth voltage line V_line3 is configured to pass through all the banks in the mesh pattern.

The first, second, third and fourth voltage lines V_line0, V_line1, V_line2, V_line3 are configured to apply a driving voltage to each of the respective data storage regions 10, 20, 30, 40 via a plurality of pads PAD, where all the driving voltages have substantially the same voltage level. Selected pads from the plurality of pads PAD are electrically coupled to each of the first, second, third and fourth voltage lines V_line0, V_line1, V_line2, V_line3. An external voltage received at the semiconductor memory apparatus is is distributed to each of the first, second, third and fourth voltage lines V_line0, V_line1, V_line2, V_line3 via the associated pads PAD. The voltages distributed to each of the first, second, third and fourth voltage lines V_line0, V_line1, V_line2, V_line3 are the driving voltages for each of the four data storage regions 10, 20, 30, 40, respectively.

The first switch group 60 is configured to electrically couple or electrically decouple the first voltage line V_line0 and the second voltage line V_line1 in response to a switching control signal CTRL_sw. For example, the first switch group 60 is configured to electrically couple the first voltage line V_line0 and the second voltage line V_line1 when the switching control signal CTRL_sw is enabled, and electrically decouple the first voltage line V_line0 and the second voltage line V_line1 when the switching control signal CTRL_sw is disabled.

The first switch group 60 includes a plurality of switches. The plurality of switches may, for example, include four switches 61, 62, 63, 64. The switches 61, 62, 63, 64 are configured to electrically couple or electrically decouple the first voltage line V_line0 and the second voltage line V_line1 in response to the switching control signal CTRL_sw.

The second switch group 70 is configured to electrically couple or electrically decouple the first voltage line V_line0 and the third voltage line V_line2 in response to the switching control signal CTRL_sw. For example, the second switch group 70 is configured to electrically couple the first voltage line V_line0 and the third voltage line V_line2 when the switching control signal CTRL_sw is enabled, and electrically decouple the first voltage line V_line0 and the third voltage line V_line2 when the switching control signal CTRL_sw is disabled.

The second switch group 70 includes a plurality of switches. The plurality of switches may, for example, include two switches 71, 72. The switches 71, 72 are configured to electrically couple or electrically decouple the first voltage line V_line0 and the third voltage line V_line2 in response to the switching control signal CTRL_sw.

The third switch group 80 is configured to electrically couple or electrically decouple the second voltage line V_line1 and the fourth voltage line V_line3 in response to the switching control signal CTRL_sw. For example, the third switch group 80 is configured to electrically couple the second voltage line V_line1 and the fourth voltage line V_line3 when the switching control signal CTRL_sw is enabled, and electrically decouple the second voltage line V_line1 and the fourth voltage line V_line3 when the switching control signal CTRL_sw is disabled.

The third switch group 80 includes a plurality of switches. The plurality of switches may, for example, include two switches 81, 82. The switches 81, 82 are configured to electrically couple or electrically decouple the second voltage line V_line1 and the fourth voltage line V_line3 in response to the switching control signal CTRL_sw.

The fourth switch group 90 is configured to electrically couple or electrically decouple the third voltage line V_line2 and the fourth voltage line V_line3 in response to the switching control signal CTRL_sw. For example, the fourth switch group 90 is configured to electrically couple the third voltage line V_line2 and the fourth voltage line V_line3 when the switching control signal CTRL_sw is enabled, and electrically decouple the third voltage line V_line2 and the fourth voltage line V_line3 when the switching control signal CTRL_sw is disabled.

The fourth switch group 90 includes a plurality of switches. The plurality of switches may, for example, include four switches 91, 92, 93, 94. The switches 91, 92, 93, 94 are configured to electrically couple or electrically decouple the third voltage line V_line2 and the fourth voltage line V_line3 in response to the switching control signal CTRL_sw.

Figure 2:
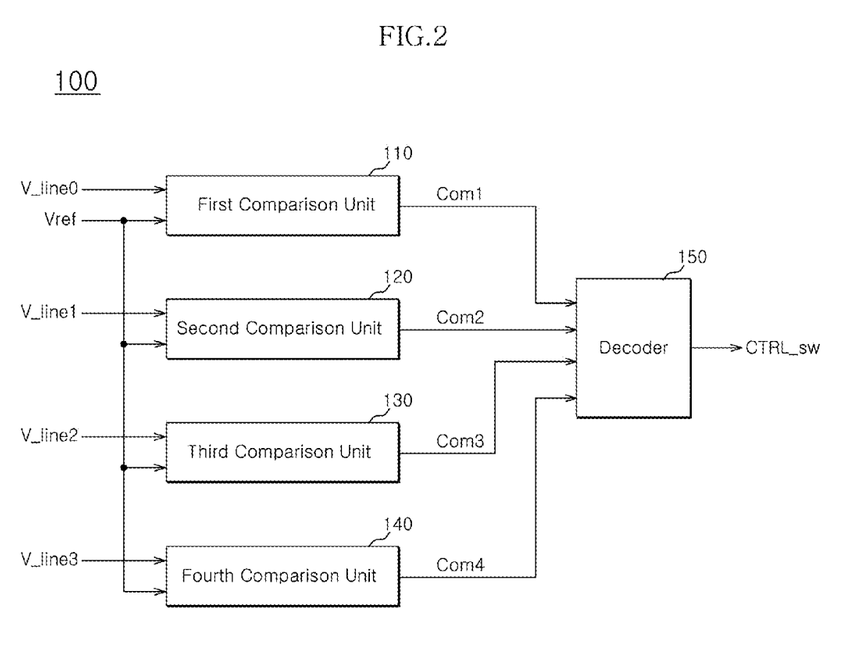
FIG. 2 is a configuration diagram of a switching control signal generation unit for controlling the switches shown in FIG. 1.

Referring to FIG. 2, an embodiment of a switching control signal generation block 100 configured to generate the switching control signal CTRL_sw is shown.

The switching control signal generation block 100 is configured to compare the voltage levels of each of the first, second, third and fourth voltage lines V_line0, V_line1, V_line2, V_line3 with the voltage level of a reference voltage Vref and responsively generate the switching control signal CTRL_sw. For example, the switching control signal generation block 100 is configured to enable the switching control signal CTRL_sw when all the voltage levels of the first, second, third and fourth voltage lines V_line0, V_line1, V_line2, V_line3 are relatively lower than the voltage level of the reference voltage Vref. The switching control signal generation block 100 is configured to disable the switching control signal CTRL_sw when any one of the first, second, third and fourth voltage lines V_line0, V_line1, V_line2, V_line3 has a voltage level that is relatively higher than the voltage level of the reference voltage Vref.

The switching control signal generation block 100 includes first, second, third, fourth comparison units 110, 120, 130, 140 and a decoder 150.

The first comparison unit 110 is configured to compare the voltage level of the first voltage line V_line0 with the voltage level of the reference voltage Vref and responsively generate a first comparison signal Com1. For example, the first comparison unit 110 is configured to enable the first comparison signal Com1 when the voltage level of the first voltage line V_line0 is relatively lower than the voltage level of the reference voltage Vref. The first comparison unit 110 is configured to disable the first comparison signal Com1 when the voltage level of the first voltage line V_line0 is relatively higher than the voltage level of the reference voltage Vref.

The second comparison unit 120 is configured to compare the voltage level of the second voltage line V_line1 with the voltage level of the reference voltage Vref and responsively generate a second comparison signal Com2. For example, the second comparison unit 120 is configured to enable the second comparison signal Com2 when the voltage level of the second voltage line V_line1 is relatively lower than the voltage level of the reference voltage Vref. The second comparison unit 120 is configured to disable the second comparison signal Com2 when the voltage level of the second voltage line V_line1 is relatively higher than the voltage level of the reference voltage Vref.

The third comparison unit 130 is configured to compare the voltage level of the third voltage line V_line2 with the voltage level of the reference voltage Vref and responsively generate a third comparison signal Com3. For example, the third comparison unit 130 is configured to enable the third comparison signal Com3 when the voltage level of the third voltage line V_line2 is relatively lower than the voltage level of the reference voltage Vref. The third comparison unit 130 is configured to disable the third comparison signal Com3 when the voltage level of the third voltage line V_line2 is relatively higher than the voltage level of the reference voltage Vref.

The fourth comparison unit 140 is configured to compare the voltage level of the fourth voltage line V_line3 with the voltage level of the reference voltage Vref and responsively generate a fourth comparison signal Com4. For example, the fourth comparison unit 140 is configured to enable the fourth comparison signal Com4 when the voltage level of the fourth voltage line V_line3 is relatively lower than the voltage level of the reference voltage Vref. The fourth comparison unit 140 is configured to disable the fourth comparison signal Com4 when the voltage level of the fourth voltage line V_line3 is relatively higher than the voltage level of the reference voltage Vref.

The decoder 150 is configured to receive the first, second, third and fourth comparison signals Com1, Com2, Com3, Com4 as inputs and responsively generate the switching control signal CTRL_sw as an output. For example, the decoder 150 is configured to enable the switching control signal CTRL_sw when all the first, second, third, and fourth comparison signals Com1, Com2, Com3, Com4 are enabled. The decoder 150 is configured to disable the switching control signal CTRL_sw when any one of the first, second, third and fourth comparison signals Com1, Com2, Com3, Com4 is disabled.

Referring back to FIG. 1, the first, second, third and fourth data storage regions 10, 20, 30, 40 each have different data paths and may perform generally simultaneous data input/output operations.

The first data storage region 10 is configured to receive the driving voltage via the first voltage line V_line0.

The second data storage region 20 is configured to receive the driving voltage via the second voltage line V_line1.

The third data storage region 30 is configured to receive the driving voltage via the third voltage line V_line2.

The fourth data storage region 40 is configured to receive the driving voltage via the fourth voltage line V_line3. The first, second, third and fourth voltage lines V_line0, V_line1, V_line2, V_line3 are configured to receive the driving voltages via the associated pads PAD. For example, the first voltage line V_line0 may be electrically coupled to a first set of pads and the second voltage line V_line1 may be electrically coupled to a second set of pads. The first voltage line V_0 receives the driving voltage via the first set of pads and the second voltage line V_line1 receives the driving voltage via the second set of pads. The voltage level of the first voltage line is substantially similar to the voltage level of the second voltage line.

The first, second, third and fourth data storage regions 10, 20, 30, 40 have different data paths and may generally simultaneously perform similar data input/output operations or may generally simultaneously perform different data input/output operations. The first, second, third and fourth data storage regions 10, 20, 30, 40 may consume different amounts of power. The amount of power consumed by a data storage region 10. 20, 30, 40 may be based on the amount of input/output data being processed by that data storage region 10. 20, 30, 40. The amount of power consumed by a data storage region 10. 20, 30, 40 may be based on the specific operations being performed by that data storage region 10, 20, 30, 40.

The voltage level of a voltage line supplying a driving voltage to a data storage region consuming a relatively large amount of power may be relatively lower than the voltage level of a voltage line supplying a driving voltage to a data storage region consuming a relatively small amount of power. For example, when the power consumption of the first data storage region 10 is the highest among the first, second, third and fourth data storage regions 10, 20, 30, 40, the voltage level of the first voltage line V_line0 supplying the driving voltage to the first data storage region 10 is relatively lower than the voltage level of the other voltage lines V_line1, V_line2, and V_line3.

In this case, the voltage level of the first voltage line V_line0 may be relatively lower than the voltage level of the reference voltage Vref, and the voltage level of the second, third and fourth voltage lines V_line1, V_line2, V_line3 may be relatively higher than the voltage level of the reference voltage Vref. In this case, the switching control signal CTRL_sw is disabled. When the switching control signal CTRL_sw is disabled, all of the switches 61, 62, 63, 64, 71, 72, 81, 82, 91, 92, 93, 94 in the first, second, third and fourth switch groups 60, 70, 80, 90 are turned off and the voltage lines V_line0, V_line1, V_line2, V_line3 are all electrically decoupled with respect to each other.

When the first, second, third and fourth voltage lines V_line0, V_line1, V_line2, V_line3 are electrically decoupled with respect to each other, the voltage level of the first voltage line V_line0 decreases and the voltage levels of the second, third and fourth voltage lines V_line1, V_line2, V_line3 may remain at a target level. As a result, it is possible to prevent the first data storage region 10 with a relatively higher power consumption level from influencing the operation of the second, third and fourth data storage regions 20, 30, 40.

If all the voltage levels of the first, second, third and fourth voltage lines V_line0, V_line1, V_line2, V_line3 are all relatively higher than the voltage level of the reference voltage Vref, the switching control signal CTRL_sw is disabled. When the switching control signal CTRL_sw is disabled all of the voltage lines V_line0, V_line1, V_line2, V_line3 are decoupled with respect to each other. In other words, when the switching control signal CTRL_sw is disabled the power consumption by each of individual data storage regions 10, 20, 30, 40 may not impact the operation of the other data storage regions 10, 20, 30, 40. If the voltage levels of the first, second, third and fourth voltage lines V_line0, V_line1, V_line2, V_line3 are all relatively lower than the voltage level of the reference voltage, the switching control signal CTRL_sw is enabled. When the switching control signal CTRL_sw is enabled the first, second, third, and fourth voltage lines V_line0, V_line1, V_line2, V_line3 are electrically coupled. Since the first, second, third and fourth voltage lines V_line0, V_line1, V_line2, V_line3 share voltage and current, a generally uniform amount of power is supplied to each of the data storage regions 10, 20, 30, 40.

Figure 3:
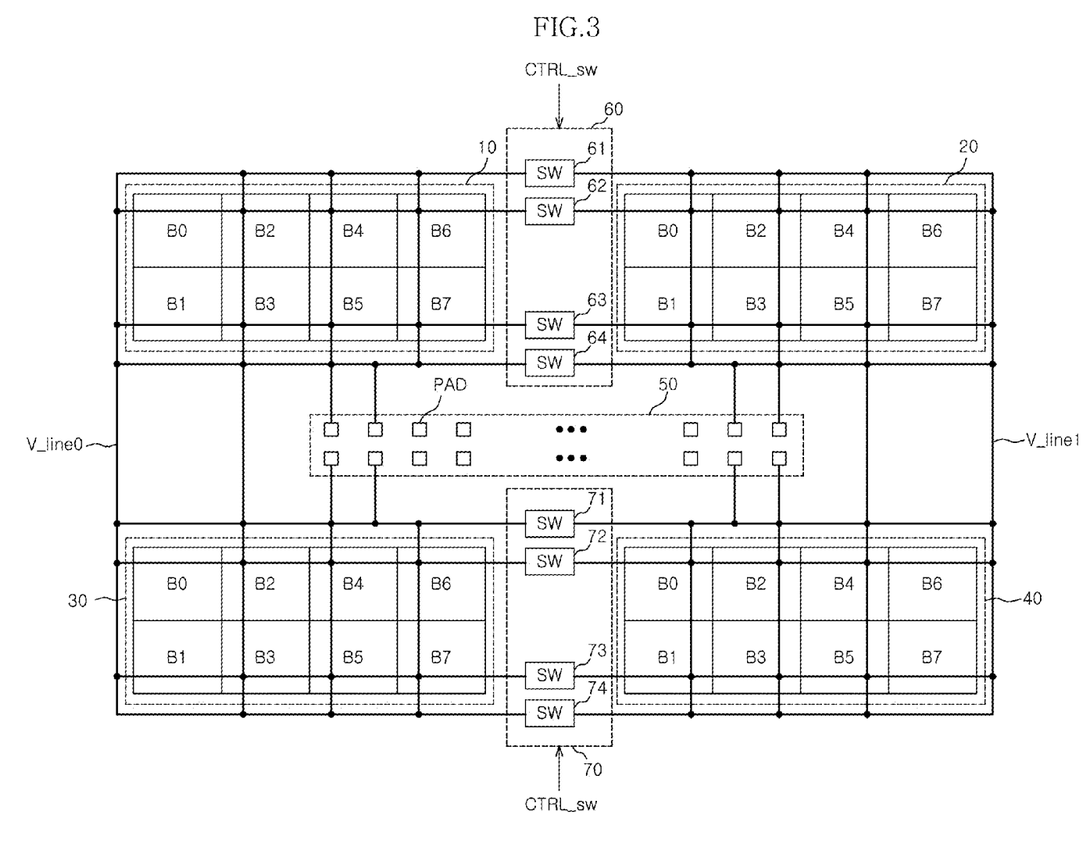
FIG. 3 is a configuration diagram of an embodiment of a semiconductor memory apparatus.

Referring to FIG. 3, an embodiment of a semiconductor memory apparatus is shown. The semiconductor memory apparatus is configured to be powered by an external voltage supplied by an external voltage source. The semiconductor apparatus includes a first data storage region 10, a second data storage region 20, a third data storage region 30, a fourth data storage region 40, a pad group 50, a first switch group 60, a second switch group 70, a first voltage line V_line0 and a second voltage line V_line1.

Each of the first, second, third and fourth data storage regions 10, 20, 30, 40 include eight banks B0, B1, B2, B3, B4, B5, B6, B7. Each bank is configured to store data and to output stored data. While in FIG. 3 each data storage region is shown as including eight banks, the number of banks included in each data storage region may, for example, include more than eight banks or fewer than eight banks. The first, second, third, and fourth data storage regions 10, 20, 30, may operate as different channels and may generally simultaneously perform data input/output operations.

The first voltage line V_line0 is configured to supply a driving voltage, to each of the first and third data storage regions 10, 30. The driving voltage is supplied the eight banks B0, B1, B2, B3, B4, B5, B6, B7 in each of the first and third data storage regions 10, via the first voltage line V_line0, where the first voltage line V_line0 is configured to pass through all the banks B0, B1, B2, B3, B4, B5, B6, B7 in each of the first and third data storage regions 10, 30 in a mesh pattern.

The second voltage line V_line1 is configured to supply a driving voltage to each of the second and fourth data storage regions 20, 40. The driving voltage is supplied to the eight banks B0, B1, B2, B3, B4, B5, B6, B7 of each of the second and fourth data storage regions 20, 40 via the second voltage line V_line1, where the second voltage line V_line1 is configured to pass through all the banks B0, B1, B2, B3, B4, B5, B6, B7 in each of the second and fourth data storage regions 20, 40 in a mesh pattern.

The first and second voltage lines V_line0, V_line1 are configured to supply the driving voltage to the associated data storage regions 10, 20, 30, 40 via a plurality of pads PAD, where all the driving voltages have substantially the same voltage levels. Selected pads from the plurality of pads PAD are electrically coupled to each of the first and second voltage lines V_line0, V_line1. An external voltage received at the semiconductor memory apparatus is distributed to the first voltage lines V_line0 and to the second voltage line via the associated pads PAD. The voltages distributed to the first voltage line V_line1 and to the second voltage line V_line2 are driving voltages for the first, second, third and fourth data storage regions 10, 20, 30, 40.

The first switch group 60 is configured to electrically couple or electrically decouple the first voltage line V_line0 and the second voltage line V_line1 in response to a switching control signal CTRL_sw. For example, the first switch group 60 is configured to electrically couple the first voltage line V_line0 to the second voltage line V_line1 when the switching control signal CTRL_sw is enabled, and to electrically decouple the first voltage line V_line0 from the second voltage line V_line1 when the switching control signal CTRL_sw is disabled.

The first switch group 60 includes a plurality of switches. The plurality of switches may, for example, include four switches 61, 62, 63, 64. The switches 61, 62, 63, 64 are configured to electrically couple first voltage line V_line0 with the second voltage line V_line1 or electrically decouple the first voltage line V_line0 from the second voltage line V_line1 in response to the switching control signal CTRL_sw. The first switch group 60 is configured to electrically couple or electrically decouple the first voltage line V_line0 for supplying the driving voltage to the first data storage region 10 with respect to the second voltage line V_line1 for supplying the driving voltage to the second data storage region 20.

The second switch group 70 is configured to electrically couple or electrically decouple the first voltage line V_line0 and the second voltage line V_line1 in response to the switching control signal CTRL_sw. For example, the second switch group 70 is configured to electrically couple the first voltage line V_line0 to the second voltage line V_line1 when the switching control signal CTRL_sw is enabled, and to electrically decouple the first voltage line V_line0 from the second voltage line V_line1 when the switching control signal CTRL_sw is disabled.

The second switch group 70 includes a plurality of switches. The plurality of switches may, for example, include four switches 71, 72, 73, 74. The switches 71, 72, 73, 74 are configured to electrically couple the first voltage line V_line0 to the second voltage line V_line1 or electrically decouple the first voltage line V_line0 from the second voltage line V_line1 in response to the switching control signal CTRL_sw. The second switch group 70 is configured to electrically couple or electrically decouple the first voltage line V_line0 for supplying the driving voltage to the third data storage region 30 with respect to the second voltage line V_line1 for supplying the driving voltage to the fourth data storage region 40.

The first switch group 60 is associated with the first data storage region 10 and the second data storage region 20. The first data storage region 10 and the third data storage region 30 both receive a driving voltage via the first voltage line V_line0. The distance between the first data storage region 10 and the second data storage region 20 is relatively shorter than the distance between the first data storage region 10 and the third data storage region 30.

The second switch group 70 is associated with the third data storage region 30 and the fourth data storage region 40. The second data storage region 20 and the fourth data storage region 40 both receive a driving voltage via the second voltage line V_line1. The distance between the third data storage region 30 and fourth data storage regions 40 is relatively shorter than the distance between the second data storage region 20 and the fourth data storage region 40.

Figure 4:
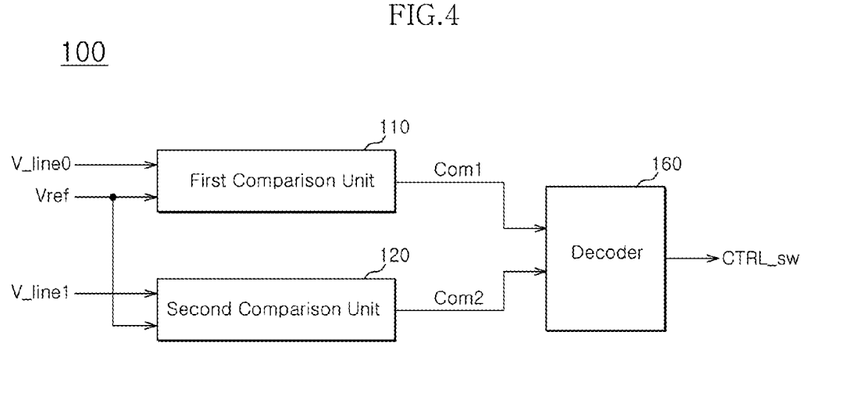
FIG. 4 is a configuration diagram of a switching control signal generation unit for controlling the switches shown in FIG. 3.

Referring to FIG. 4, an embodiment of a switching control signal generation block 100 configured to generate the switching control signal CTRL_sw is shown.

The switching control signal generation block 100 is configured to compare the voltage levels of each of the first and second voltage lines V_line0, V_line1 with a voltage level of a reference voltage Vref and responsively generate the switching control signal CTRL_sw. For example, the switching control signal generation block 100 is configured to enable the switching control signal CTRL_sw when both the voltage levels of the first and second voltage lines V_line0, V_line1 are relatively lower than the voltage level of the reference voltage Vref. The switching control signal generation block 100 is configured to disable the switching control signal CTRL_sw when one of the first and second voltage lines V_line0, V_line1 has a voltage level that is relatively higher than the voltage level of the reference voltage Vref.

The switching control signal generation block 100 includes a first comparison unit 110, a second comparison unit 120 and a decoder 130.

The first comparison unit 110 is configured to compare the voltage level of the first voltage line V_line0 with the voltage level of the reference voltage Vref and responsively generate a first comparison signal Com1. For example, the first comparison unit 110 is configured to enable the first comparison signal Com1 when the voltage level of the first voltage line V_line0 is relatively lower than the voltage level of the reference voltage Vref. The first comparison unit 110 is configured to disable the first comparison signal Com1 when the voltage level of the first voltage line V_line0 is relatively higher than the voltage level of the reference voltage Vref.

The second comparison unit 120 is configured to compare the voltage level of the second voltage line V_line1 with the voltage level of the reference voltage Vref and responsively generate a second comparison signal Com2. For example, the second comparison unit 120 is configured to enable the second comparison signal Com2 when the voltage level of the second voltage line V_line1 is relatively lower than the voltage level of the reference voltage Vref. The second comparison unit 120 is configured to disable the second comparison signal Com2 when the voltage level of the second voltage line V_line1 is relatively higher than the voltage level of the reference voltage Vref.

The decoder 160 is configured to receive the first and second comparison signals Com1, Com2 as inputs and responsively generate the switching control signal CTRL_sw as an output. For example, the decoder 160 is configured to enable the switching control signal CTRL_sw when both the first and second comparison signals Com1, Com2 are enabled. The decoder 160 is configured to disable the switching control signal CTRL_sw when one of the first and second comparison signals Com1, Com2 is disabled.

Referring back to FIG. 3, the first, second, third and fourth data storage regions 10, 20, 30, 40 each have different data paths and may perform generally simultaneously data input/output operations.

The first and third data storage regions 10, 30 are configured to receive the driving voltage via the first voltage line V_line0.

The second and fourth data storage regions 20, 40 are configured to receive the driving voltage via the second voltage line V_line1. The first and second voltage lines V_line0, V_line1 are configured to receive the driving voltages via the associated pads PAD. For example, the first voltage line may be electrically coupled to a first set of pads and the second voltage line may be electrically coupled to a second set of pads. The driving voltage may be received at the first voltage line via the first set of pads and the driving voltage may be received at the second voltage line via the second set of pads.

The first, second, third and fourth data storage regions 10, 20, 30, 40 have different data paths and may generally simultaneously perform similar data input/output operations or may generally simultaneously perform different data input/output operations. For example the first data storage region may have a first data path and the fourth data storage region may have a second data path. The first data path may be different from the second data path and the first and second data storage regions may perform data input/output operations at substantially the same time.

The first, second, third, and fourth data storage regions 10, 20, 30, 40 may consume different amounts of power. The amount of power consumed by a data storage region 10, 20, 30, 40 may be based on the amount of input/output data being processed by that data storage region 10, 20, 30, 40. The amount of power consumed by a data storage region 10, 20, 30, 40 may be based on the specific operations being performed by that data storage region 10, 20, 30, 40.

The voltage level of a voltage line supplying a driving voltage to a data storage region consuming a relatively large amount of power may be relatively lower than the voltage level of a voltage line supplying a driving voltage to a data storage region consuming a relatively small amount of power. For example, when the power consumption of the first data storage region 10 is the highest among the first, second, third and fourth data storage regions 10, 20, 30, 40 the voltage level of the first voltage line V_line0 supplying the driving voltage to the first data storage region 10 is relatively lower than the voltage level of the second voltage line V_line1.

In this case, the voltage level of the first voltage line V_line0 may be relatively lower than the voltage level of the reference voltage Vref and the voltage level of the second voltage line V_line1 may be relatively higher than the voltage level of the reference voltage Vref. In this case, the switching control signal CTRL_sw is disabled. When the switching control signal CTRL_sw is disabled, all the switches 61, 62, 63, 64, 71, 72, 73, 74 in the first and second switch groups 60, 70 are turned off and the first voltage line V_line0 is electrically decoupled from the second voltage lines V_line1.

When first voltage lines V_line0 is electrically decoupled from the second voltage lines V_line1, the voltage level of the first voltage line V_line0 decreases and the voltage level of the second voltage line V_line1 may remain a target level. As a result, it may be possible to prevent the first data storage region 10 with a relatively higher power consumption level from influencing the operation of the second data storage region 20. While the first voltage line V_line0 supplies the driving voltage to both the first and third data storage regions 10, 30, since the distance between the first data storage region 10 and the third data storage region 30 is relatively longer than the distance between the first data storage region 10 and the second data storage region 20, the power consumption of the first data storage region 10 does not impact the third data storage region 30.

The distance between the first data storage region and the third data storage region is relatively longer than the distance between the first data storage region and the second data storage region. The distance between the first data storage region and the third data storage region is relatively longer than the distance between the third data storage region and the fourth data storage region. The distance between the second data storage region and the fourth data storage region is relatively longer than the distance between the second data storage region and the first data storage region. The distance between the second data storage region and the fourth data storage region is relatively longer than a distance between the fourth data storage region and the third data storage region.

If the voltage levels of both the first and second voltage lines V_line0, V_line1 are relatively higher than the voltage level of the reference voltage Vref, the switching control signal CTRL_sw is disabled and the first voltage lines V_line0 is electrically decoupled from the second voltage line V_line1. In other words, since the first and third data storage regions 10, 30 are supplied driving voltages via a first voltage line V_line0 and the second and fourth data storage regions 20, 40 are supplied driving voltages via a second voltage line V_line, when the switching control signal CTRL_sw is disabled, operation of the first and third data storage regions 10, 30 do not influence the operation of the second and fourth data storage regions 20, 40.

If the voltage levels of both the first and second voltage lines V_line0, V_line1 are relatively lower than the voltage level of the reference voltage Vref, the switching control signal CTRL_sw is enabled. When the switching control signal CTRL_sw is enabled, the first voltage lines V_line0 is electrically coupled with the second voltage line V_line1. Since the first and second voltage lines V_line0, V_line1 share voltage and current, a relatively uniform supply of power is supplied to each of the data storage regions 10, 20, 30 and 40.

Figure 5:
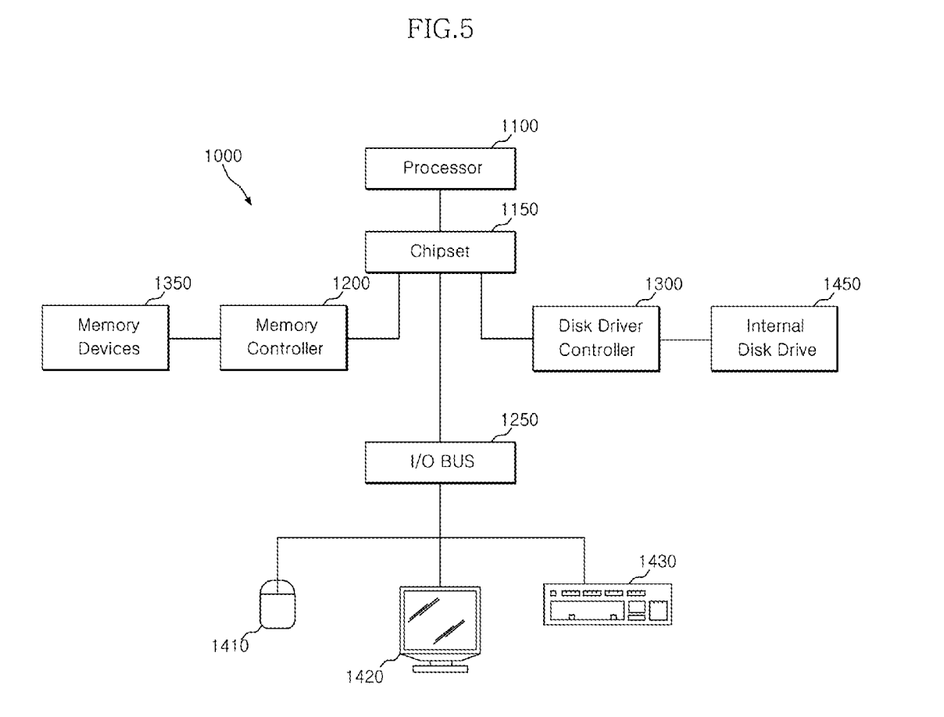
FIG. 5 is a block diagram representation of a system including an embodiment of a semiconductor memory apparatus.

Referring to FIG. 5, a block diagram representation of a system 1000 including an embodiment of a semiconductor memory apparatus 1350 is shown. The system 1000 includes one or more semiconductor memory apparatus 1350 and a memory controller 1200. In an embodiment, the semiconductor memory apparatus 1350 is substantially similar to the semiconductor apparatus of FIG. 1. In an embodiment the switching control signal generation unit is substantially similar to the switching control generation unit of FIG. 2.

In an embodiment, the semiconductor memory apparatus 1350 is substantially similar to the semiconductor memory apparatus of FIG. 3. In an embodiment the a switching control signal generation unit is substantially similar to the switching control generation unit of FIG. 4.

In an embodiment, a switching control signal generation unit is disposed in the semiconductor memory apparatus 1350. In an embodiment, the switching control signal generation unit is disposed in the memory controller 1200.

Examples of the semiconductor memory apparatus 1350 include, but are not limited to, dynamic random access memory, static random access memory, synchronous dynamic random access memory (SDRAM), synchronous graphics random access memory (SGRAM), double data rate dynamic ram (DDR), and double data rate SDRAM.

The memory controller 1200 is used in the design of memory devices, processors, and computer systems. The system 1000 may include one or more processors or central processing units ("CPUs") 1100. The CPU 1100 may be used individually or in combination with other CPUs. While the CPU 1100 will be referred to primarily in the singular, it will be understood by those skilled in the art that a system with any number of physical or logical CPUs may be implemented A chipset 1150 may be electrically coupled to the CPU 1100. The chipset 1150 is a communication pathway for signals between the CPU 1100 and other components of the system 1000, which may include the memory controller 1200, an input/output ("I/O") bus 1250, and a disk drive controller 1300. Depending on the configuration of the system 1000, any one of a number of different signals may be transmitted through the chipset 1150, and those skilled in the art will appreciate that the routing of the signals throughout the system 1000 can be readily adjusted without changing the underlying nature of the system.

As stated above, the memory controller 1200 may be electrically coupled to the chipset 1150. The memory controller 1200 can receive a request provided from the CPU 1100, through the chipset 1150. In alternate embodiments, the memory controller 1200 may be integrated into the chipset 1150. The memory controller 1200 may be electrically coupled to one or more memory devices 1350. The memory devices 1350 may be any one of a number of industry standard memory types, including but not limited to, single inline memory modules ("SIMMs") and dual inline memory modules ("DIMMs"). Further, the semiconductor memory apparatus 1350 may facilitate the safe removal of the external data storage devices by storing both instructions and data.

The chipset 1150 may be electrically coupled to the I/O bus 1250. The I/O bus 1250 may serve as a communication pathway for signals from the chipset 1150 to I/O devices 1410, 1420 and 1430. The I/O devices 1410, 1420 and 1430 may include a mouse 1410, a video display 1420, or a keyboard 1430. The I/O bus 1250 may employ any one of a number of communications protocols to communicate with the I/O devices 1410, 1420, and 1430. Further, the I/O bus 1250 may be integrated into the chipset 1150.

The disk drive controller 1450 may also be electrically coupled to the chipset 1150. The disk drive controller 1450 may serve as the communication pathway between the chipset 1150 and one or more internal disk drives 1450. The internal disk drive 1450 may facilitate disconnection of the external data storage devices by storing both instructions and data. The disk drive controller 1300 and the internal disk drives 1450 may communicate with each other or with the chipset 1150 using virtually any type of communication protocol, including all of those mentioned above with regard to the I/O bus 1250.

The system 1000 described above in relation to FIG. 5 is merely one example of a system employing a semiconductor memory apparatus 1350 and a switching control signal generation unit. In alternate embodiments, such as cellular phones or digital cameras, the components may differ from the embodiment shown in FIG. 5.

While certain embodiments have been described above, it will be understood to those skilled in the art that the embodiments described are by way of example only. Accordingly, the semiconductor memory apparatus described herein should not be limited based on the described embodiments. Rather, the semiconductor memory apparatus described herein should only be limited in light of the claims that follow when taken in conjunction with the above description and accompanying drawings.

What is claimed is:

1. A semiconductor memory apparatus comprising:
   a first data storage region configured to be supplied with a driving voltage via a first voltage line;
   a second data storage region configured to be supplied with a driving voltage via a second voltage line;
   a switch configured to one of electrically couple the first voltage line with the second voltage line and electrically decouple the first voltage line from the second voltage line in response to a switching control signal, and
   a switching control signal generation block configured to compare a voltage level of the first voltage line with a reference voltage and a voltage level of the second voltage line with the reference voltage and responsively generate the switching control signal.

2. The semiconductor memory apparatus according to claim 1, wherein the first data storage region has a first data path and the second data storage region has a second data path, wherein the first data path is different from the second data path and the first and second data storage regions may perform data input/output operations at substantially the same time.

3. The semiconductor memory apparatus according to claim 2, wherein the first voltage line is electrically coupled to a first set of pads and the second voltage line is electrically coupled to a second set of pads and the voltage level of the first voltage line is substantially similar to the voltage level of the second voltage line.

4. The semiconductor memory apparatus according to claim 1, wherein the switching control signal generation block enables the switching control signal when both the voltage levels of the first voltage line and the second voltage line are relatively lower than a voltage level of the reference voltage and disables the switching control signal when one of the first voltage line and the second voltage line has a voltage level that is relatively higher than the voltage level of the reference voltage.

5. The semiconductor memory apparatus according to claim 4, wherein the switching control signal generation block comprises:
   a first comparison unit configured to compare the voltage level of the first voltage line and the voltage level of the reference voltage, and generate a first comparison signal;
   a second comparison unit configured to compare the voltage level of the second voltage line and the voltage level of the reference voltage and generate a second comparison signal; and
   a decoder configured to receive the first and second comparison signals as inputs and responsively generate the switching control signal.

6. The semiconductor memory apparatus according to claim 4, wherein the switch electrically couples the first voltage line to the second voltage line when the switching control signal is enabled and decouples the first voltage line from the second voltage line when the switching control signal is disabled.

7. A semiconductor memory apparatus comprising:
   a plurality of data storage regions, wherein each of the plurality of data storage regions is configured to be electrically coupled with one of a plurality of voltage lines and receive a driving voltage via the associated voltage line;
   a plurality of switches configured to one of electrically couple the plurality of voltage lines to each other and decouple the plurality of voltage lines from one another in response to a switching control signal; and
   a switching control signal generation block configured to enable the switching control signal when all voltage levels of the plurality of voltage lines are relatively lower than a voltage level of a reference voltage,
   wherein the switching control signal generation block enables the switching control signal when all the voltage levels of the plurality of voltage lines are relatively lower than the voltage level of the reference voltage, and disables the switching control signal when one of the plurality of voltage lines has a voltage level that is relatively higher than the voltage level of the reference voltage.

8. The semiconductor memory apparatus according to claim 7, wherein the plurality of switches are configured to electrically couple the plurality of voltage lines to one another when the switching control signal is enabled, and to electrically decouple the plurality of voltage lines from one another when the switching control signal is disabled.

9. The semiconductor memory apparatus according to claim 7, wherein the switching control signal generation block comprises:
   a plurality of comparison units configured to compare the voltage level of each of the plurality of voltage lines with the voltage level of the reference voltage and responsively generate a plurality of comparison signals; and
   a decoder configured to receive the plurality of comparison signals as inputs and responsively generate the switching control signal as an output.

10. A semiconductor memory apparatus comprising:
    a first data storage region and a third data storage region configured to receive a driving voltage via a first voltage line;
    a second data storage region and a fourth data storage region configured to receive a driving voltage via a second voltage line;
    a switch configured to one of couple the first voltage line to the second voltage line and decouple the first voltage line from the second voltage line in response to a switching control signal, and
    a switching control signal generation block configured to enable the switching control signal when voltage levels of the first voltage line and the second voltage line are relatively lower than a voltage level of a reference voltage and to disable the switching control signal when one of the first voltage line and the second voltage line has a voltage level that is relatively higher than the voltage level of the reference voltage.

11. The semiconductor memory apparatus according to claim 10, wherein the first data storage region has a first data patch and the fourth data storage region has a second data path, wherein the first data path is different from the second data path and the first and second data storage regions perform data input/output operations at substantially the same time.

12. The semiconductor memory apparatus according to claim 11, wherein each of the first, second, third and fourth data storage regions comprises a plurality of banks.

13. The semiconductor memory apparatus according to claim 11, wherein the first voltage line is electrically coupled to a first set of pads and the second voltage line is electrically coupled to a second set of pads and wherein the driving voltage is received at the first voltage line via the first set of pads and the driving voltage is received at the second voltage line via the second set of pads.

14. The semiconductor memory apparatus according to claim 11,
    wherein a distance between the first data storage region and the third data storage region is relatively longer than a distance between the first data storage region and the second data storage region and is relatively longer than a distance between the third data storage region and the fourth data storage region, and
    wherein a distance between the second data storage region and the fourth data storage region is relatively longer than a distance between the second data storage region and the first data storage region and is relatively longer than a distance between the fourth data storage region and the third data storage region.

15. The semiconductor memory apparatus according to claim 10, wherein the switch is configured to electrically couple the first voltage line with the second voltage line when the switching control signal is enabled and to decouple the first voltage line from the second voltage line when the switching control signal is disabled.

* * * * *